United States Patent
Bulusu et al.

(10) Patent No.: US 7,406,560 B2
(45) Date of Patent: Jul. 29, 2008

(54) USING MULTIPLE NON-VOLATILE MEMORY DEVICES TO STORE DATA IN A COMPUTER SYSTEM

(75) Inventors: Mallik Bulusu, Olympia, WA (US); Michael A. Rothman, Puyallup, WA (US); Vincent J. Zimmer, Federal Way, WA (US); Andrew J. Fish, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 232 days.

(21) Appl. No.: 11/425,685

(22) Filed: Jun. 21, 2006

(65) Prior Publication Data

US 2007/0300007 A1 Dec. 27, 2007

(51) Int. Cl.
*G06F 12/00* (2006.01)
(52) U.S. Cl. .......................... 711/103; 711/4; 711/113; 711/115; 711/122; 365/185.33
(58) Field of Classification Search ................ 711/103; 365/185.33
See application file for complete search history.

(56) References Cited

U.S. PATENT DOCUMENTS

| 7,328,304 | B2* | 2/2008 | Royer et al. ................ 711/113 |
| 2006/0149902 | A1* | 7/2006 | Yun et al. .................... 711/118 |
| 2007/0016719 | A1* | 1/2007 | Ono et al. .................... 711/103 |

* cited by examiner

*Primary Examiner*—Donald Sparks
*Assistant Examiner*—Hashem Farrokh
(74) *Attorney, Agent, or Firm*—Konrad Raynes & Victor LLP; David W. Victor

(57) ABSTRACT

Provided are a method, system, and machine readable medium for using multiple non-volatile memory devices to store data in a computer system. Access to a first and second memory devices are managed. The first memory device has faster read access and slower write access relative to the second memory device and the second memory device has slower read access and faster write access relative to the first memory device. Write requests to the first memory device are cached in the second memory device.

25 Claims, 5 Drawing Sheets

USING MULTIPLE NON-VOLATILE MEMORY DEVICES TO STORE DATA IN A COMPUTER SYSTEM

BACKGROUND

A computer system includes a basic input/output system (BIOS) memory that stores the code for the boot sequence the central processing unit (CPU) executes to power-on and initialize the computer components. Typically, the CPU executing the BIOS code initializes certain hardware components, such as the memory, and then spins-up the hard disk drives. After the hard disk drives are operable, the CPU will then load the operating system from one hard disk drive to boot the system. In certain implementations, the boot code or BIOS may be stored in a NOR flash device, where the boot code may be executed directly "in-place" from the NOR device.

Another ubiquitous form of flash memory is the NAND memory device, which typically is less expensive and stores several times more data than a NOR device. A NOR device provides faster read access, but slower write access relative to the NAND device.

DETAILED DESCRIPTION

Figure 1:
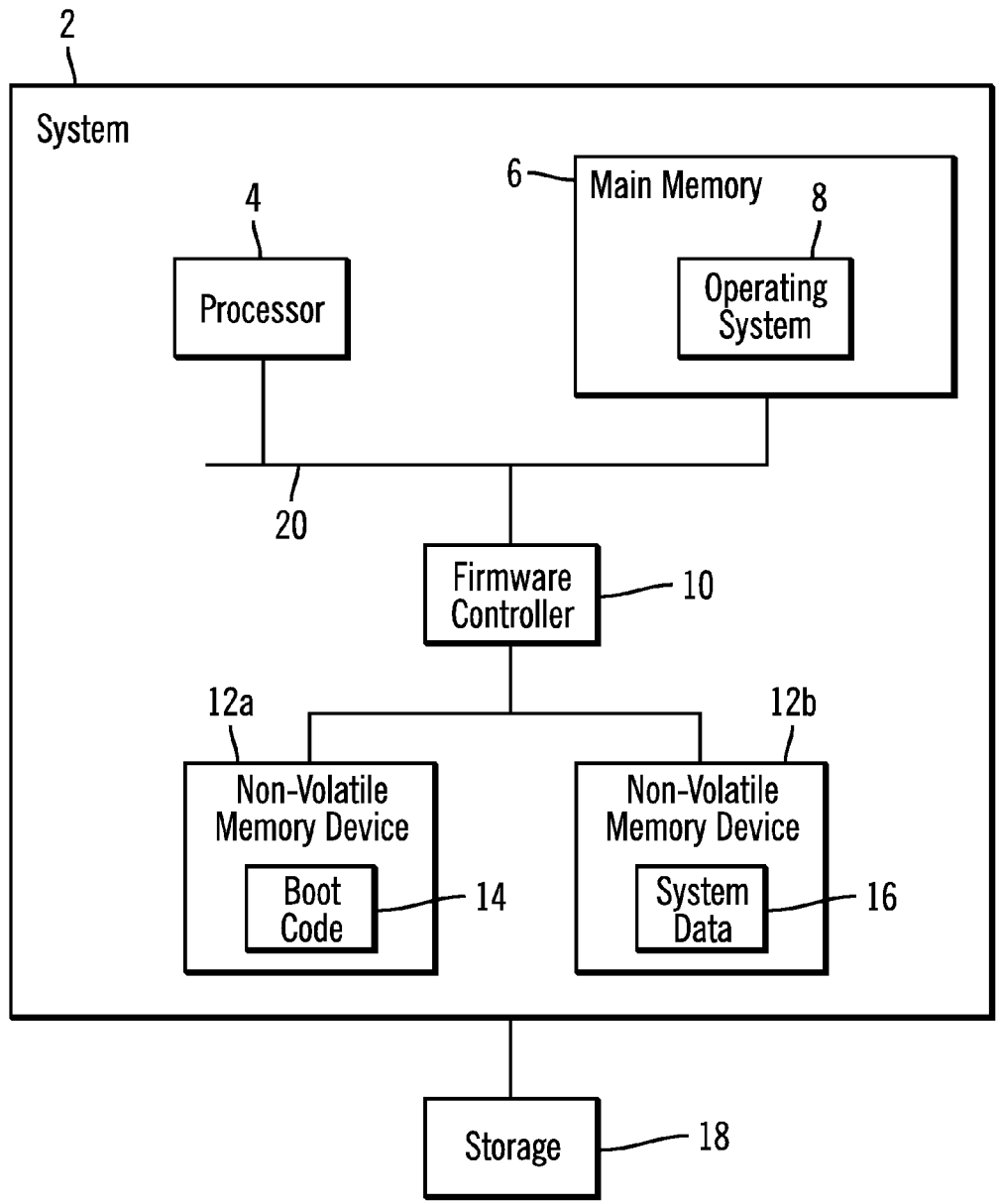
FIG. 1 illustrates an embodiment of a computer system.

FIG. 1 illustrates a computing environment used with the described embodiments. A system 2 includes a processor 4 coupled to a main memory 6. The main memory 6 stores programs and data used by the processor 4 during system operations, such as an operating system 8, application programs (not shown), etc. A firmware controller 10 enables the processor 2 to access code and data in two non-volatile memory devices 12a, 12b. The non-volatile memory device 12a includes boot code 14 executing during system 2 initialization, such as a power-on reset. The non-volatile memory device 12b includes system data 16 used by the operating system 8 during system operations. In one embodiment, data and variables comprising the system data 16 is not accessed or used during a boot or initialization process, e.g., power-on self test (POST), initial program load (IPL), etc. A storage device 18 is coupled to the system 2 and includes data, the operating system 8, and application programs accessed and loaded into the memory 6 for execution. One or more bus interfaces 20 provide communication among the processor 4, main memory 6, and firmware controller 10.

In one embodiment, one non-volatile memory device 12a has faster read access than the other non-volatile memory device 12b, but slower write access. For instance, the non-volatile memory device 12a having the faster read access may comprise a NOR flash memory and the non-volatile memory device 12 b having the slower read access and faster write access may comprise a NAND flash memory. In certain embodiments, the NOR flash 12a has substantially faster read access, but slower write access than the NAND 12b. Further, the NAND 12b typically provides a greater amount of storage space than the NOR device 12b at a lower cost. In this way, the second non-volatile memory device 12b (e.g., NAND) provides additional space for the operating system 8 to buffer data between operations and power cycles.

In an embodiment where the system 2 chipset has a north bridge and south bridge components, the firmware controller 10 may be implemented in an I/O controller hub (ICH) in the north bridge chipset.

In one embodiment, the firmware controller 10 and non-volatile memory devices 12a, 12b may be implemented on the system motherboard (not shown). Alternatively, the memory devices 12a, 12b and/or firmware controller 10 may be implemented in a device connected to the system 2 via a cable and interface.

The firmware controller 10 provides an abstraction of the storage space in the non-volatile memory devices 12a, 12b for use by the operating system 8 and application programs. The firmware controller 10 may provide one interface, e.g., application program interface (API), called by the operating system 8 to instruct the firmware controller 10 to write data to the faster read access first non-volatile memory device 12a. The firmware controller 10 may also provide another interface (API) called by the operating system 8 to instruct the firmware controller 10 to write data to the faster write access second non-volatile memory device 12b, but not copy over to the faster read access first non-volatile memory device 12 a. These interfaces may be invoked to write the data to the first 12a or second 12b non-volatile memory devices for a first time.

Figure 2:
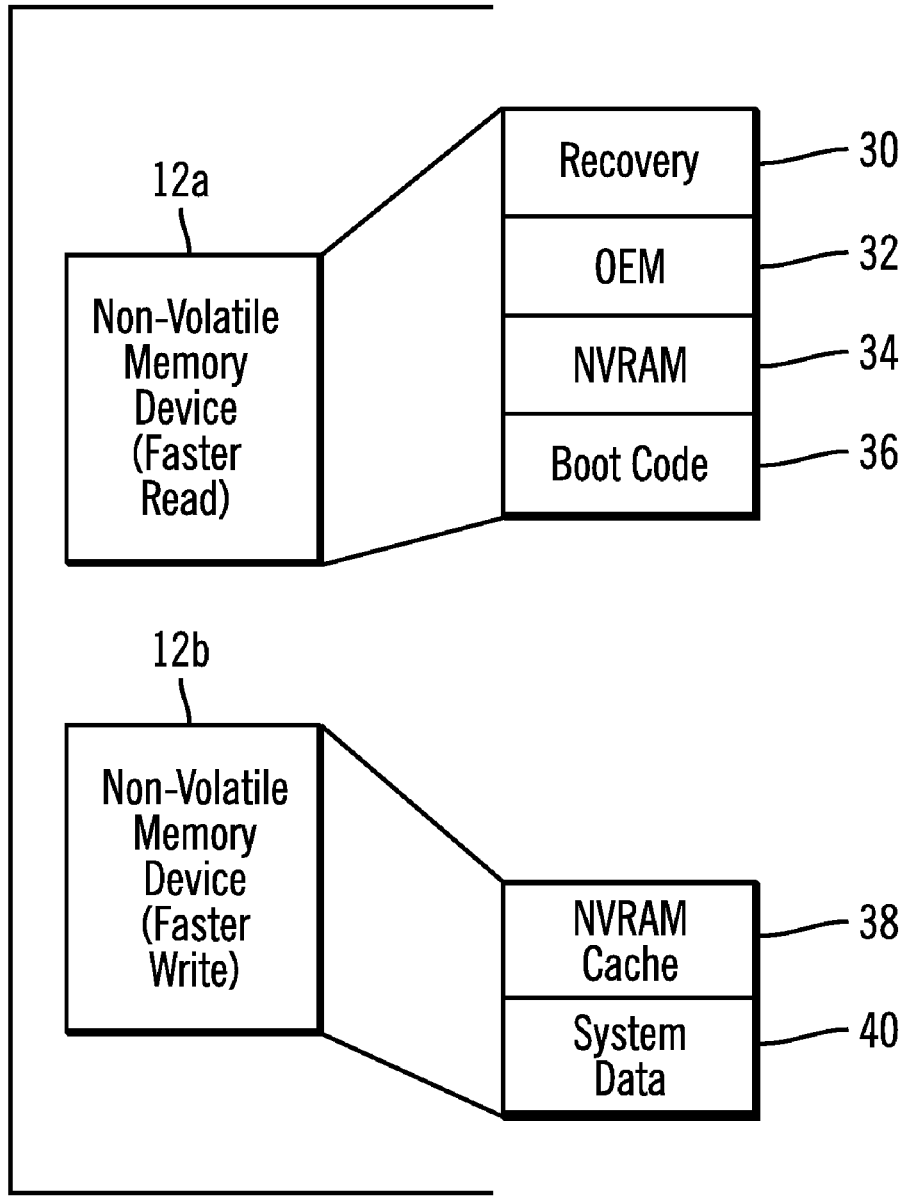
FIG. 2 illustrates an embodiment of a mapping of data types to non-volatile memory devices.

FIG. 2 illustrates an embodiment of how information and addresses map to addressable locations or data in the non-volatile memory devices 12a, 12b. In one embodiment, the faster read access non-volatile memory device 12a includes data required during initialization or boot operations, such as recovery data 30 related to any failures that occurred before the last power cycle that need to be considered, vendor (OEM) data 32 used during the boot operations, non-volatile random access memory (NVRAM) data 34 stored by the operating system 8, and the boot code 14. The non-volatile memory device 12b includes an NVRAM cache 38 used to buffer data being written to the non-volatile memory device 12a and system data 16, such as an error log, licensing information or other information the operating system 8 wants to maintain in a non-volatile fashion for fast access. For instance, the operating system 8 may maintain licensing information to authenticate access to the operating system 8 or application programs loaded into the main memory 6.

Figure 3:
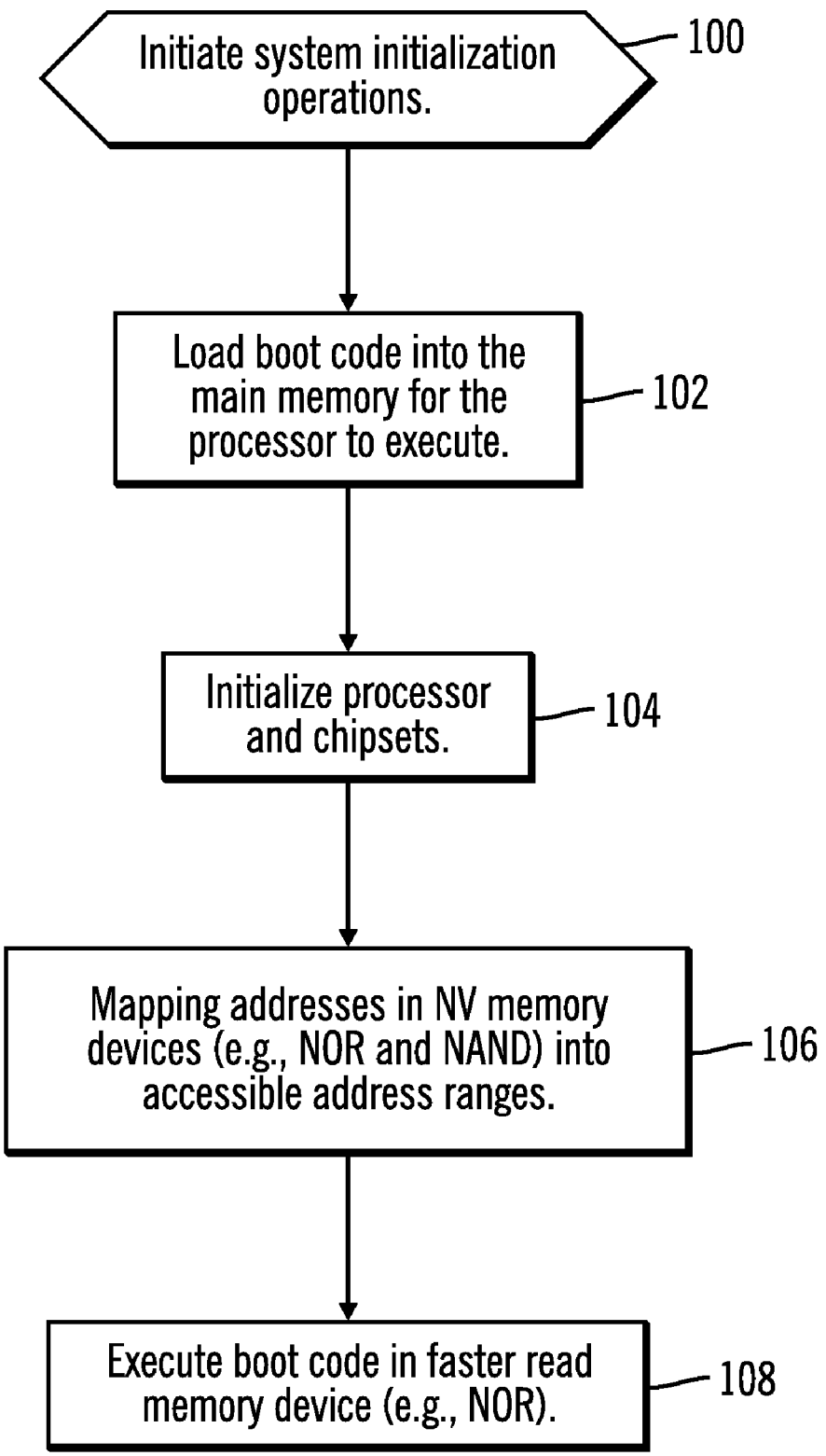
FIG. 3 illustrates an embodiment of operations for an initialization sequence.

FIG. 3 illustrates an embodiment of operations performed in the system 2 as part of a boot sequence or initialization. Upon initiating (at block 100) the boot sequence, boot code 14 is loaded (at block 102) into the main memory 6 for the processor 4 to execute to initialize components. At block 104, the processor 4 executes the boot code 14 to initialize chipsets, including the firmware controller 10, and the processor 4 registers. As part of initialization, the firmware controller 10 maps (at block 106) ranges of addresses in the non-volatile memory devices 12a, 12b into accessible address ranges. The firmware controller 10 may further generate a hash table of data or files stored in the non-volatile memory devices 12a, 12b. The processor 4 may then execute (at block 108) boot code 14 directly from the faster read memory device (e.g., NOR) as part of an execute-in-place operation. Alternatively, the boot code 14 may be copied to the main memory 6 before execution by the processor 6.

Figure 4:
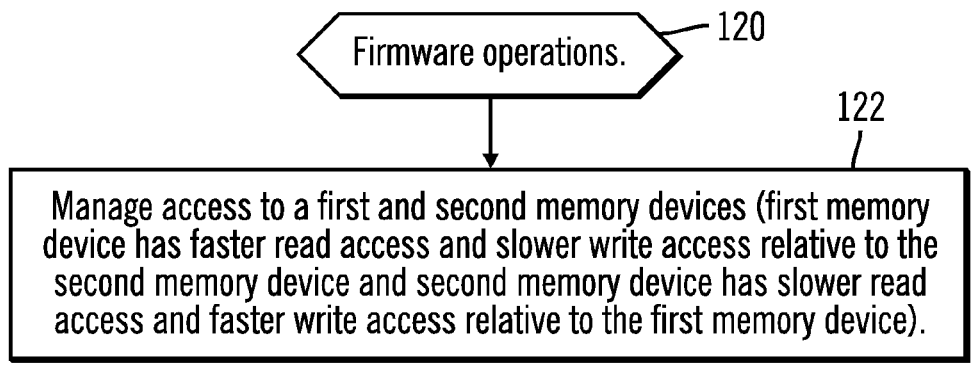
FIG. 4 illustrates an embodiment of operations for a firmware controller to manage non-volatile memory devices.

FIG. 4 illustrates an embodiment of operations (at block 120) performed by the firmware controller 10 where the firmware controller 10 manages (at block 122) access to the non-volatile memory devices 12a, 12b. In one embodiment, the memory device 12a (e.g., a NOR) has faster read access and slower write access relative to the memory device 12b and the memory device 12b (e.g., NAND) has slower read access and faster write access relative to the first memory device.

Figure 5:
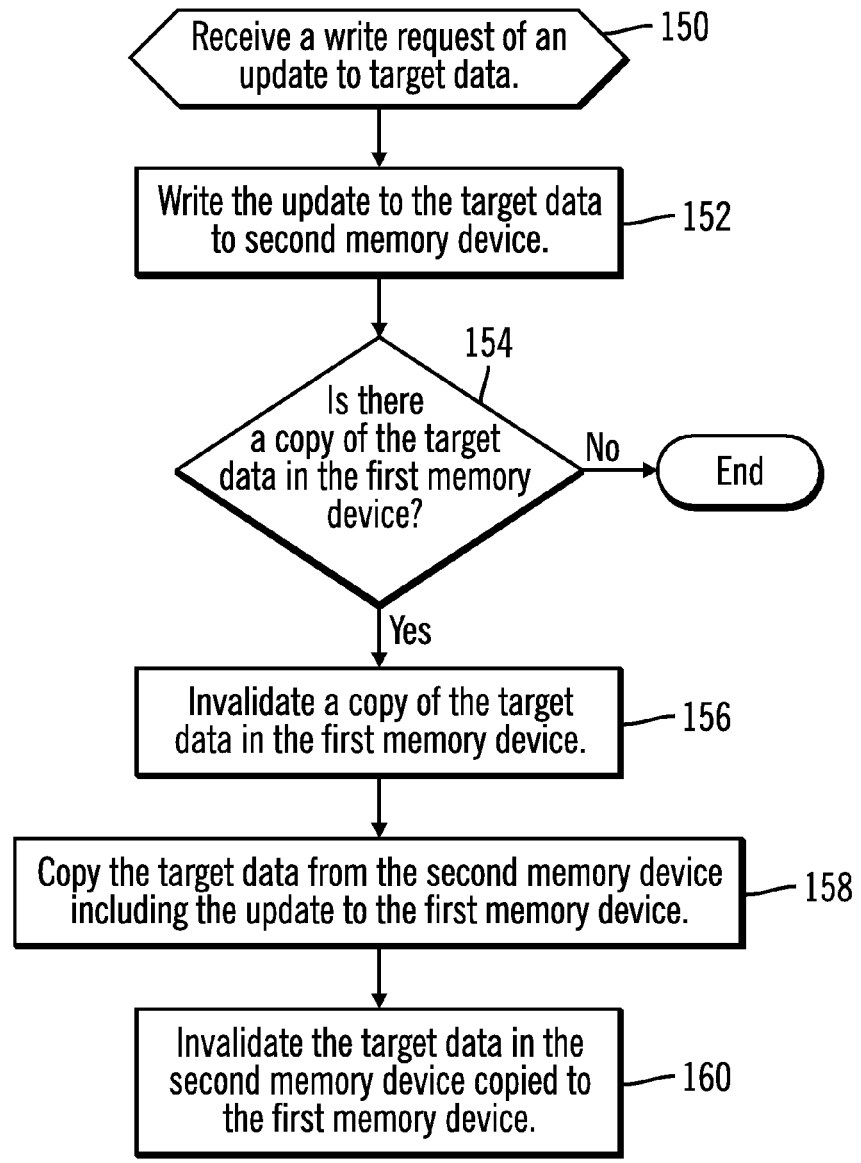
FIG. 5 illustrates an embodiment of operations to process a write request with respect to the non-volatile memory devices.

FIG. 5 illustrates an embodiment of operations performed by the firmware controller 10 to process an update to target data already written to the non-volatile memory device 12a or 12b using the firmware controller 10 interfaces. Upon receiving (at block 150) of an update, the firmware controller 10 writes (at block 152) the update to the target data to the faster write access non-volatile memory device 12b, such as in the NVRAM cache 38. If (at block 154) there is a copy of the target data in the fast access first memory device 12a, such as data of the type 30, 32, and 36, then the firmware controller 10 invalidates (at block 156) a copy of the target data in the memory device 12a. At some point, the firmware controller 10 copies (at block 158) the target data from the memory device 12b including the update to the memory device 12a. The copying from the non-volatile memory device 12b to non-volatile memory device 12a may be performed as part of a background operation during low system utilization to batch copy updates to data in the non-volatile memory device 12a. After copying the data to the non-volatile memory device 12 a, the firmware controller 10 invalidates (at block 160) the target data in the memory device 12b copied to the memory device 12a.

If (at block 154) there is not a copy of the target data maintained in the non-volatile memory device 12a, then the data is not copied over to the non-volatile memory device 12a. In one embodiment, if the update is maintained in an NVRAM cache 38, then the firmware controller 10 may copy the updates to the location where the data is stored as system data 40, such as an error log.

Figure 6:
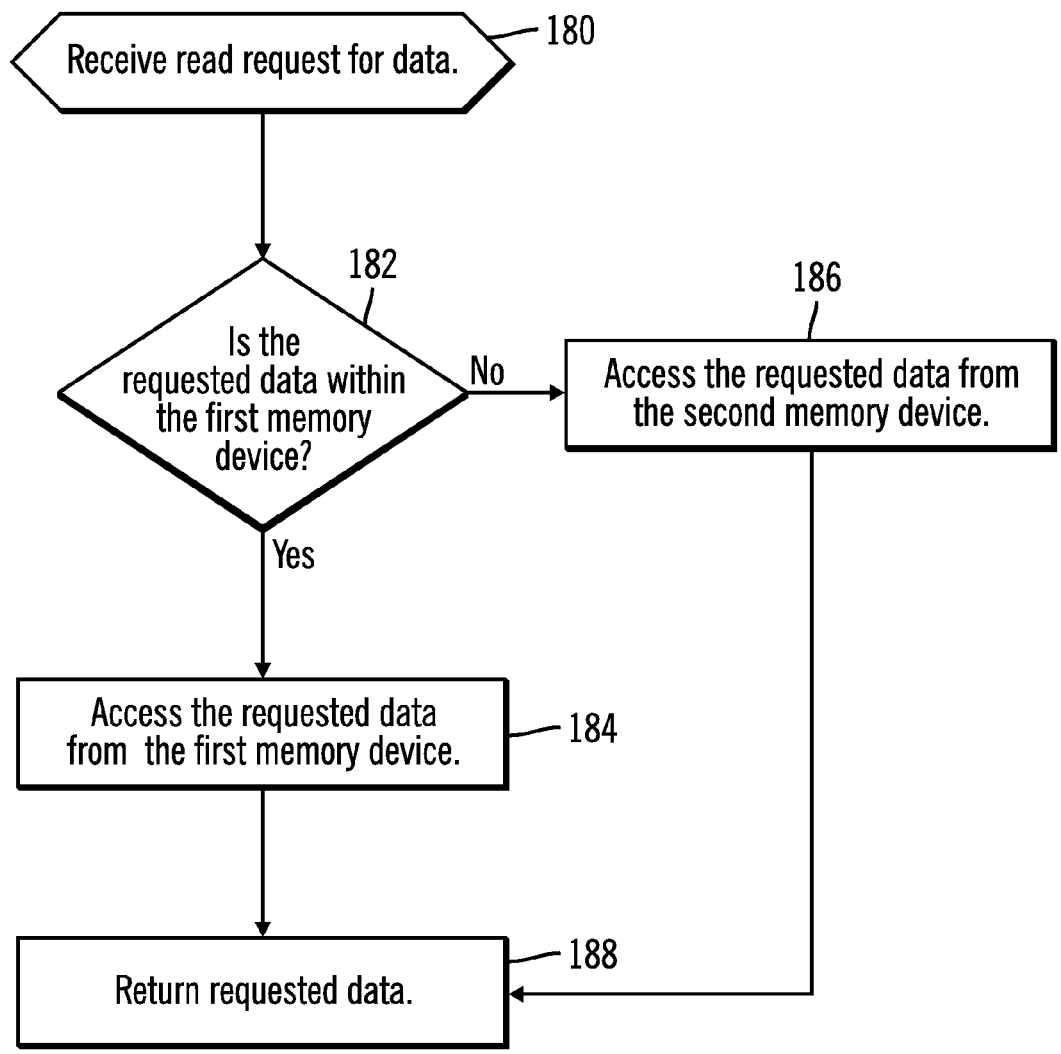
FIG. 6 illustrates an embodiment of operations to process a read request with respect to the non-volatile memory devices.

FIG. 6 illustrates an embodiment of operations performed by the firmware controller 10 to process a read request from the operating system 8 or an application program for data in one of the non-volatile memory devices 12a, 12b. The request may request a name of the data, e.g., a file name, record name, data name or an address. Upon receiving (at block 180) a read request to data, if the firmware controller 10 determines (at block 182) that the requested data is in the faster read access non-volatile memory device 12 a, then the data is accessed (at block 184) from the non-volatile memory device 12 a. Otherwise, if (at block 182) the requested data is not in the faster access non-volatile memory device 12ab, then the firmware controller 10 accesses (at block 186) the requested data from the second non-volatile memory device 12b. The accessed data is returned (at block 188) to the operating system 8 initiating the request.

The described embodiments provide techniques for maintaining data in multiple non-volatile memory devices 12a, 12b, where one device has superior read access performance and the other has superior write access performance. The described embodiments provide operations to optimize between both reads and writes for data stored in the first and/or second non-volatile memory devices.

The described operations may be implemented as a method, apparatus or article of manufacture using standard programming and/or engineering techniques to produce software, firmware, hardware, or any combination thereof. The described operations may be implemented as code maintained in a "computer readable medium", where a processor may read and execute the code from the computer readable medium. A computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. The code implementing the described operations may further be implemented in hardware logic (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The transmission signals in which the code or logic is encoded is capable of being transmitted by a transmitting station and received by a receiving station, where the code or logic encoded in the transmission signal may be decoded and stored in hardware or a computer readable medium at the receiving and transmitting stations or devices. A "machine readable medium" comprises computer readable medium, hardware logic, and/or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the present invention, and that the article of manufacture may comprise suitable information bearing medium known in the art.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

A character used to represent a variable number of an element, e.g., 54c, 58b, 52b, 4b, may indicate any number of instances of the element, and may indicate different integer numbers when used with different elements or with the same element in different instances.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or that a different number of devices may be used than the multiple number shown.

The functionality and/or the features of a device may be alternatively embodied by one or more other devices which are not explicitly described as having such functionality/features. Thus, other embodiments of the present invention need not include the device itself.

The illustrated operations of FIGS. 3, 4, 5, and 6 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method, comprising:
   managing access to a first and second memory devices, wherein the first memory device has faster read access and slower write access relative to the second memory device and wherein the second memory device has slower read access and faster write access relative to the first memory device; and
   caching write requests to the first memory device in the second memory device.

2. The method of claim 1, wherein the first and second memory devices comprise non-volatile memory devices.

3. The method of claim 2, wherein the first memory device comprises a NOR memory device and wherein the second memory device comprises a NAND memory device.

4. The method of claim 1, wherein caching write requests to the first memory device in the second memory device comprises:
   receiving a write request of an update to target data;
   writing the update to the second memory device;
   invalidating a copy of the target data in the first memory device;
   copying the target data from the second memory device including the update to the first memory device; and
   invalidating the target data in the second memory device copied to the first memory device.

5. The method of claim 4, further comprising:
   determining whether there is a copy of the target data in the first memory device, wherein the operations of invalidating the corresponding copy, copying the target data from the second memory device to the first memory device, and invalidating the target data are performed in response to determining that there is a copy of the target data in the first memory device, wherein data is not copied from the second memory device to the first memory device in response to determining that the copy of the target data is not included in the first memory device.

6. The method of claim 1, further comprising:
   receiving a read request for data;
   determining whether the requested data is within the first memory device;
   accessing the requested data from the first memory device in response to determining that the requested data is in the first memory device; and
   accessing the requested data from the second memory device in response to determining that the requested data is not in the first memory device.

7. The method of claim 1, wherein the first and second memory devices are included in a computer system and wherein the first memory device includes boot code executed during a power-on routine to initialize the computer system, and wherein the second memory device includes data that is not used during the power-on routine.

8. The method of claim 1, wherein the first and second memory devices are included in a computer system executing an operating system, further comprising:
   providing a first interface to the operating system to enable the operating system to write data to the first memory device; and
   providing a second interface to the operating system to enable the operating system to write data to the second memory device, wherein the first and second memory devices enable the operating system to retain data between power cycles.

9. A device in communication with a first and second memory devices, comprising:
   management logic to manage access to the first and second memory devices, wherein the first memory device has faster read access and slower write access relative to the second memory device and wherein the second memory device has slower read access and faster write access relative to the first memory device; and
   caching logic to cache write requests to the first memory device in the second memory device.

10. The device of claim 9, wherein the first and second memory devices comprise non-volatile memory devices.

11. The device of claim 10, wherein the first memory device comprises a NOR memory device and wherein the second memory device comprises a NAND memory device.

12. The device of claim 9, wherein the caching logic to cache write requests to the first memory device in the second memory device further:
   receives a write request of an update to target data;
   writes the update to the second memory device;
   invalidates a copy of the target data in the first memory device;
   copies the target data from the second memory device including the update to the first memory device; and
   invalidates the target data in the second memory device copied to the first memory device.

13. The device of claim 12, wherein the caching logic to cache write requests further:

determines whether there is a copy of the target data in the first memory device, wherein the operations of invalidating the corresponding copy, copying the target data from the second memory device to the first memory device, and invalidating the target data are performed in response to determining that there is a copy of the target data in the first memory device, wherein data is not copied from the second memory device to the first memory device in response to determining that the copy of the target data is not included in the first memory device.

14. The device of claim 9, wherein the device further includes read request processing logic to:
  receive a read request for data;
  determine whether the requested data is within the first memory device;
  access the requested data from the first memory device in response to determining that the requested data is in the first memory device; and
  access the requested data from the second memory device in response to determining that the requested data is not in the first memory device.

15. A system, comprising:
  a first and second memory devices;
  a device in communication with the first and second memory devices, comprising:
    management logic to manage access to the first and second memory devices, wherein the first memory device has faster read access and slower write access relative to the second memory device and wherein the second memory device has slower read access and faster write access relative to the first memory device; and
    caching logic to cache write requests to the first memory device in the second memory device.

16. The system of claim 15, wherein the first memory device includes boot code to execute during a power-on routine to initialize the system, and wherein the second memory device includes data that is not used during the power-on routine.

17. The system of claim 15, further comprising:
  an operating system;
  a first interface to the operating system to enable the operating system to write data to the first memory device; and
  a second interface to the operating system to enable the operating system to write data to the second memory device, wherein the first and second memory devices enable the operating system to retain data between power cycles.

18. A machine readable storage medium storing instructions that when executed causes the machine to perform operations with respect to a first and second memory devices and to further:
  manage access to the first and second memory devices, wherein the first memory device has faster read access and slower write access relative to the second memory device and wherein the second memory device has slower read access and faster write access relative to the first memory device; and
  cache write requests to the first memory device in the second memory device.

19. The machine readable storage medium of claim 18, wherein the first and second memory devices comprise non-volatile memory devices.

20. The machine readable medium of claim 19, wherein the first memory device comprises a NOR memory device and wherein the second memory device comprises a NAND memory device.

21. The machine readable storage medium of claim 18, wherein the operations to cache write requests to the first memory device in the second memory device further:
  receive a write request of an update to target data;
  write the update to the second memory device;
  invalidate a copy of the target data in the first memory device;
  copy the target data from the second memory device including the update to the first memory device; and
  invalidate the target data in the second memory device copied to the first memory device.

22. The machine readable storage medium of claim 11, wherein the operations further:
  determine whether there is a copy of the target data in the first memory device, wherein the operations of invalidating the corresponding copy, copying the target data from the second memory device to the first memory device, and invalidating the target data are performed in response to determining that there is a copy of the target data in the first memory device, wherein data is not copied from the second memory device to the first memory device in response to determining that the copy of the target data is not included in the first memory device.

23. The machine readable storage medium of claim 18, wherein the operations further:
  receive a read request for data;
  determine whether the requested data is within the first memory device;
  access the requested data from the first memory device in response to determining that the requested data is in the first memory device; and
  access the requested data from the second memory device in response to determining that the requested data is not in the first memory device.

24. The machine readable storage medium of claim 18, wherein the first and second memory devices are included in a computer system and wherein the first memory device includes boot code executed during a power-on routine to initialize the computer system, and wherein the second memory device includes data that is not used during the power-on routine.

25. The machine readable storage medium of claim 18, wherein the first and second memory devices are included in a computer system executing an operating system, wherein the operations further:
  provide a first interface to the operating system to enable the operating system to write data to the first memory device; and
  provide a second interface to the operating system to enable the operating system to write data to the second memory device, wherein the first and second memory devices enable the operating system to retain data between power cycles.

* * * * *

UNITED STATES PATENT AND TRADEMARK OFFICE
CERTIFICATE OF CORRECTION

PATENT NO. : 7,406,560 B2  
APPLICATION NO. : 11/425685  
DATED : July 29, 2008  
INVENTOR(S) : Mallik Bulusu et al.

Page 1 of 1

It is certified that error appears in the above-identified patent and that said Letters Patent is hereby corrected as shown below:

In the Claims,

Col. 8, Line 4, delete "readable medium" and replace with --readable storage medium--.

Signed and Sealed this
Thirty-first Day of March, 2015

Michelle K. Lee
*Director of the United States Patent and Trademark Office*